United States Patent
Riga et al.

(10) Patent No.: US 11,360,850 B2
(45) Date of Patent: Jun. 14, 2022

(54) ERROR PROTECTION KEY GENERATION METHOD AND SYSTEM

(71) Applicant: ARM LIMITED, Cambridge (GB)

(72) Inventors: Michele Riga, Cambridge (GB); Kauser Yakub Johar, Cambridge (GB)

(73) Assignee: Arm Limited, Cambridge (GB)

( * ) Notice: Subject to any disclaimer, the term of this patent is extended or adjusted under 35 U.S.C. 154(b) by 714 days.

(21) Appl. No.: 15/073,807

(22) Filed: Mar. 18, 2016

(65) Prior Publication Data
US 2016/0321137 A1 Nov. 3, 2016

(30) Foreign Application Priority Data
Apr. 29, 2015 (GB) ..................................... 1507317

(51) Int. Cl.
*G06F 11/10* (2006.01)
*H03M 13/13* (2006.01)
(Continued)

(52) U.S. Cl.
CPC ...... *G06F 11/1076* (2013.01); *G06F 11/1012* (2013.01); *H03M 13/13* (2013.01);
(Continued)

(58) Field of Classification Search
CPC ............ G06F 11/1076; G06F 11/1012; H03M 13/13; H03M 13/2906; H03M 13/35; H03M 13/356; H03M 13/618; H03M 13/6368
See application file for complete search history.

(56) References Cited

U.S. PATENT DOCUMENTS 5,146,461 A 9/1992 Duschatko et al.
5,642,242 A * 6/1997 Ozaki .................. H04N 5/9264
360/32
(Continued)

FOREIGN PATENT DOCUMENTS

CN 1714512 12/2005
CN 102255729 11/2011
(Continued)

OTHER PUBLICATIONS

Extended European Search Report dated Oct. 24, 2016 in EP 16162086.9, 7 pages.
(Continued)

*Primary Examiner* — April Y Blair
*Assistant Examiner* — Dipakkumar B Gandhi
(74) *Attorney, Agent, or Firm* — Nixon & Vanderhye P.C.

(57) ABSTRACT

An error protection key generation method and system are provided, the method being used to generate a key for use in computing an error protection code for an input data value according to a chosen error protection scheme. The method comprises inputting a plurality of desired data value sizes, and then applying a key generation algorithm to generate a key for use in computing the error protection code for a maximum data value size amongst the plurality of data value sizes. The key generation algorithm is arranged so that it generates the key so as to comprise a plurality of sub-keys, where each sub-key is associated with one of the input data value sizes, and where each sub-key conforms to a key requirement of the error protection scheme. As a result, a generic key is produced containing a plurality of sub-keys, where each sub-key is associated with a particular desired data value size, and can be extracted and used independently given that each sub-key conforms to the error protection scheme requirements. This provides significant benefits in (Continued)

the design and verification of error protection circuits using such keys.

16 Claims, 14 Drawing Sheets

(51) Int. Cl.
*H03M 13/00* (2006.01)
*H03M 13/35* (2006.01)
*H03M 13/29* (2006.01)
*G06F 11/24* (2006.01)

(52) U.S. Cl.
CPC ....... *H03M 13/2906* (2013.01); *H03M 13/35* (2013.01); *H03M 13/356* (2013.01); *H03M 13/618* (2013.01); *H03M 13/6368* (2013.01)

(56) References Cited

U.S. PATENT DOCUMENTS

| | | | | |
|---|---|---|---|---|
| 2003/0217046 | A1* | 11/2003 | Yuan | G06F 16/902 |
| 2004/0098659 | A1 | 5/2004 | Bjerke et al. | |
| 2005/0180459 | A1* | 8/2005 | Watson | H03M 13/1111 370/468 |
| 2006/0130154 | A1* | 6/2006 | Lam | G06F 21/64 726/30 |
| 2009/0217139 | A1 | 8/2009 | Roh et al. | |
| 2010/0325511 | A1 | 12/2010 | Oh et al. | |
| 2011/0043391 | A1* | 2/2011 | Lee | H03M 13/033 341/106 |
| 2011/0320693 | A1* | 12/2011 | Assarpour | H04L 12/4625 711/108 |
| 2012/0151301 | A1 | 6/2012 | Izumi et al. | |
| 2013/0061115 | A1* | 3/2013 | Imai | H03M 13/19 714/763 |

FOREIGN PATENT DOCUMENTS

| | | |
|---|---|---|
| CN | 103646219 | 3/2014 |
| CN | 103997402 | 8/2014 |
| WO | WO 2009/136751 | 11/2009 |

OTHER PUBLICATIONS

Search Report for GB 1507317.4, dated Nov. 23, 2015, 10 pages.
UK Examination Report dated Jul. 17, 2018 in GB Application No. 1507317.4, 7 pages.
Office Action for Japanese Application No. 2016-084992 dated Nov. 12, 2019 and English translation, 7 pages.
First Office Action for CN Application No. 201610258545.1 dated Apr. 8, 2020 and English translation, 17 pages.
Search Report for CN Application No. 201610258545.1 dated Oct. 9, 2020 with Notice of Allowance and English translation, 2 pages.

* cited by examiner

| dw | 4 | 8 | 16 | 32 | 47 | 64 |
|---|---|---|---|---|---|---|
| ew, SECDED | 4 | 5 | 6 | 7 | 7 | 8 |
| ew, SEDDED | 3 | 4 | 5 | 6 | 6 | 7 |

FIG. 5

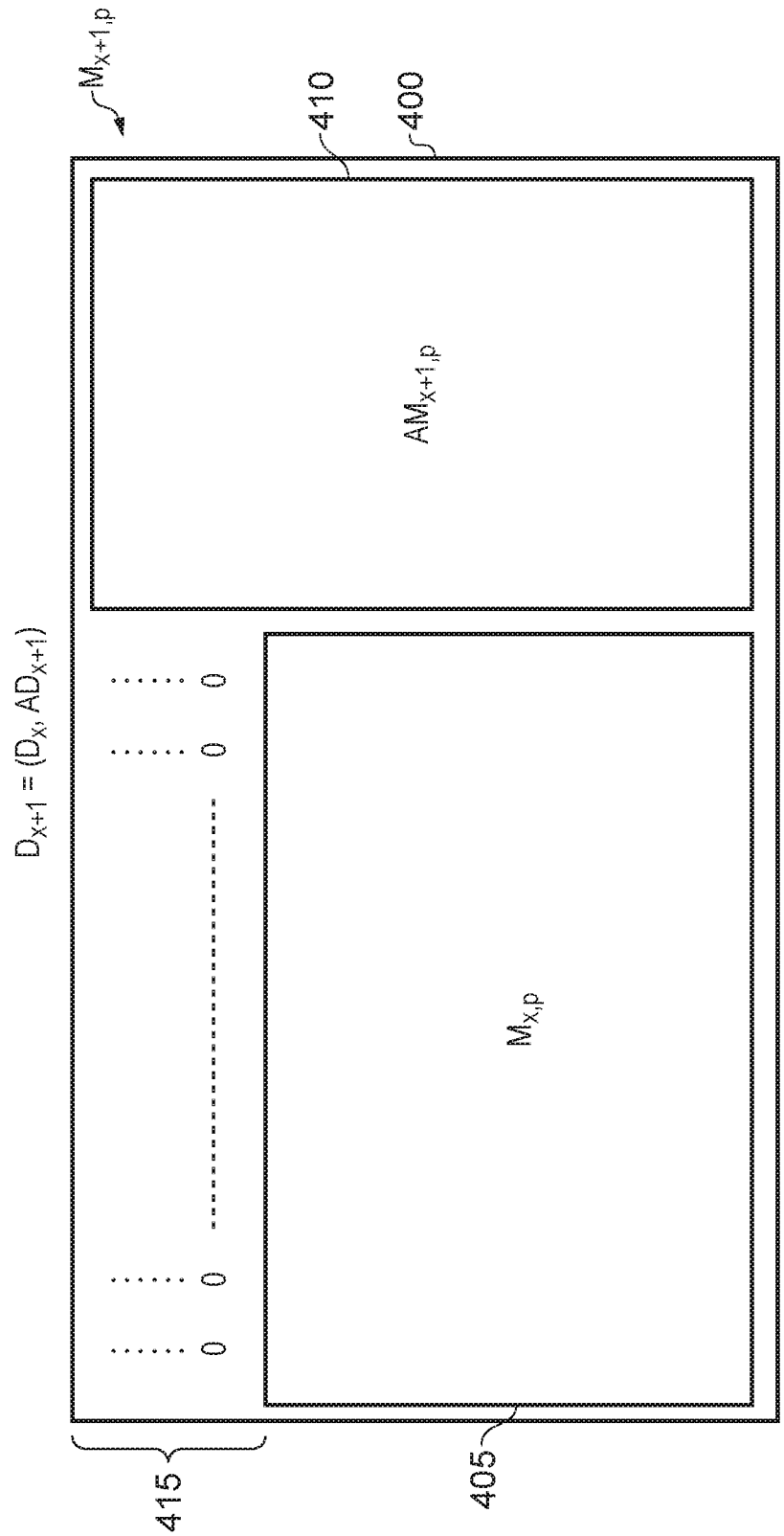

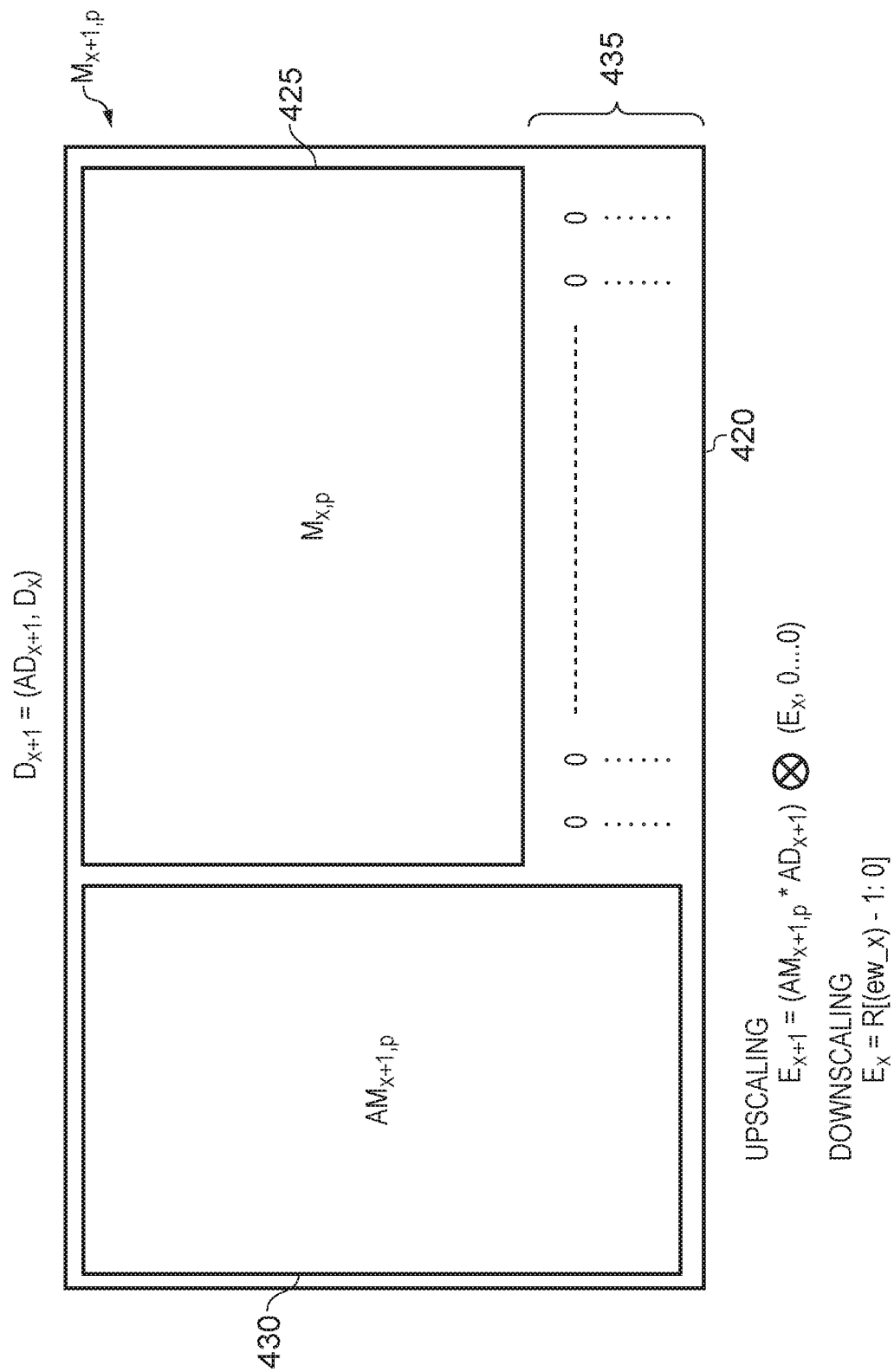

ERROR PROTECTION KEY GENERATION METHOD AND SYSTEM

This application claims priority to GB Patent Application No. 1507317.4 filed 29 Apr. 2015, the entire content of which is hereby incorporated by reference.

BACKGROUND

The present technique relates to a method and system for generating a key for use in computing an error protection code for an input data value, and to a data processing system incorporating error protection circuits for performing computations using the key.

In data processing systems, it is known to provide error protection mechanisms with the aim of improving the robustness to errors of various data values propagated within the data processing system. In particular, an error protection code can be generated for associating with a data value, and then later that error protection code can be used in combination with the data value to detect situations where the data value has been corrupted, due for example to a soft or a hard error. The error protection code may be sufficient merely to identify that there is an error with the data, or the error protection code may be sufficient not only to enable the presence of the error to be detected, but also to enable the error to be corrected. Generally, both types of error protection code are referred to as error correction codes (ECCs), and accordingly herein the error protection code will also be referred to as an ECC.

In such data processing systems, there will typically be provided error protection circuits in the form of error protection code generation circuits that generate the error protection code to be associated with a data value, and also error protection circuits in the form of error checking circuits that analyse the data value and its associated error protection code in order to detect situations where the data value has been subjected to an error, and to correct that error if the error protection scheme allows for such correction.

In accordance with typical error protection schemes, a key is generated that is used both by the error protection code generation circuit to generate the error protection code for an input data value, and which is also used by the error checking circuitry in combination with the data value and associated error protection code in order to enable errors to be identified and corrected.

For any particular error protection scheme, the size of the key (also referred to herein as a mask) is typically dependent on the size of the data value to be protected. It is often the case within a data processing system that data values of various different sizes will be propagated within the system, and hence different keys will be required in order to provide appropriate protection for those various different sizes of data value.

Typically, the standard practice is to generate a unique key for each specific input data value size, the key being generated having regard to the error protection scheme. However, with the proliferation in the number of different sized data values being processed within a data processing system, all with their associated uniquely generated keys, this has led to significant design and verification costs associated with the generation of the necessary error protection circuits for use within the data processing system. It would be desirable to provide a mechanism which enabled a reduction in such design and verification costs.

SUMMARY

In one example configuration, there is provided a computer-implemented method of generating a key for use in computing an error protection code for an input data value according to an error protection scheme, comprising: inputting a plurality of data value sizes: and applying a key generation algorithm to generate a key for use in computing the error protection code for a maximum data value size amongst said plurality of data value sizes, the key generation algorithm generating the key to comprise a plurality of sub-keys, each sub-key being associated with one of the input data value sizes and conforming to a key requirement for the error protection scheme.

In another example configuration, there is provided a non-transitory computer program product providing a computer program which, when executed on a computer, performs a method of generating a key for use in computing an error protection code for an input data value according to an error protection scheme, in accordance with the above mentioned example configuration.

In a yet further example configuration, there is provided a data processing system comprising: a plurality of error protection circuits including at least a first error protection circuit to handle data values of a first data value size, and a second error protection circuit to handle data values of a second data value size different to said first data value size; said first and second error protection circuits comprising computation circuitry to perform a computation utilising a sub-key selected from a key generated in accordance with the above-mentioned method, for each of the first and second error protection circuits the sub-key being selected based on the associated data value size handled by that error protection circuit.

In a still further example configuration, there is provided a data processing system comprising: a plurality of error protection means including at least a first error protection means for handling data values of a first data value size, and a second error protection means for handling data values of a second data value size different to said first data value size; said first and second error protection means comprising computation means for performing a computation utilising a sub-key selected from a key generated in accordance with the above-mentioned method, for each of the first and second error protection means the sub-key being selected based on the associated data value size handled by that error protection means.

BRIEF DESCRIPTION OF THE DRAWINGS

The present technique will be described further, by way of example only, with reference to embodiments thereof as illustrated in the accompanying drawings, in which:

FIG. 5 schematically illustrates the size of error correction code produced for different data value sizes, and for two different error protection schemes, in accordance with one embodiment;

FIGS. 11A to 11C illustrate alternative forms for the mask of FIG. 7, in accordance with different embodiments.

DESCRIPTION OF EMBODIMENTS

Figure 1:
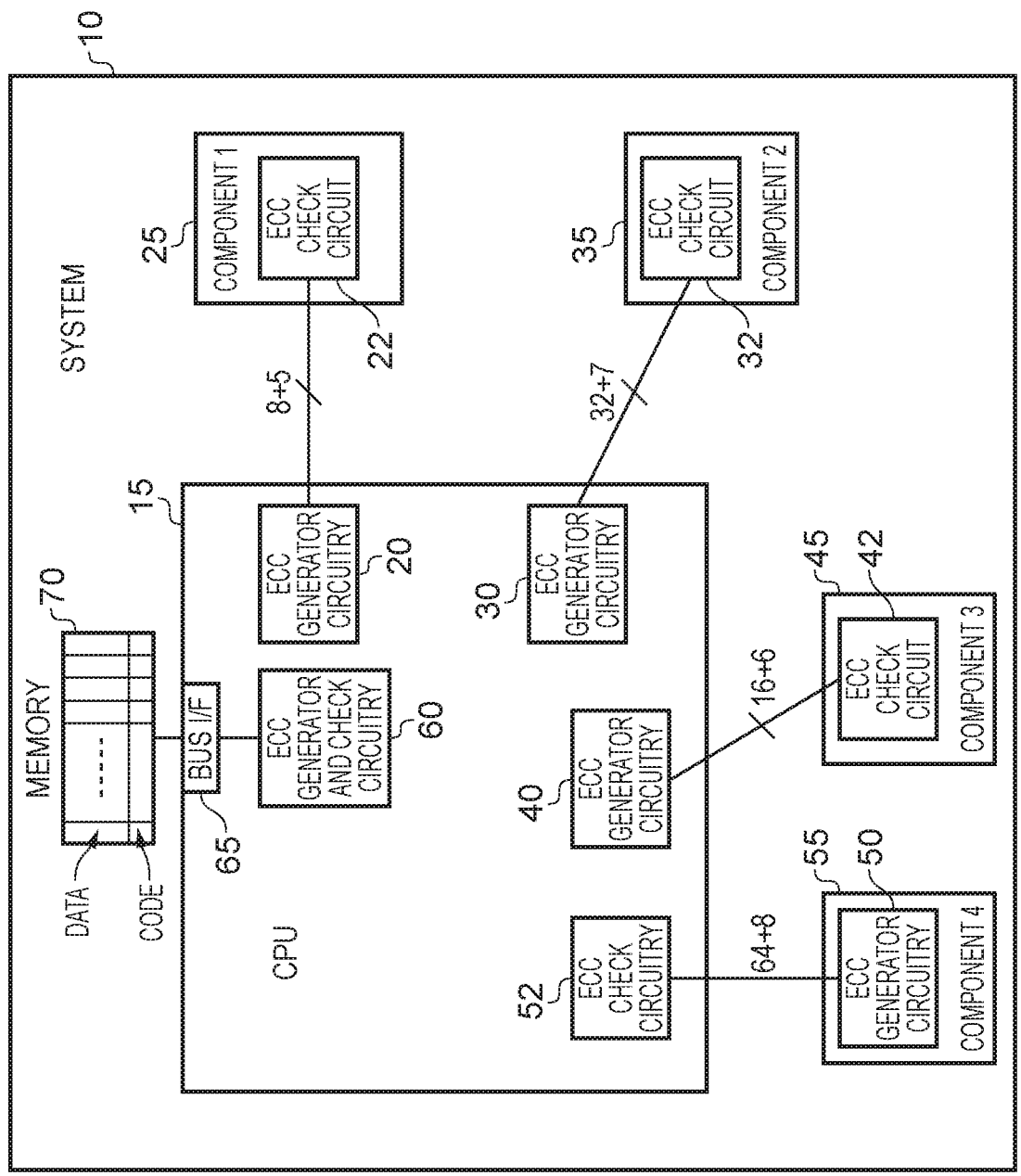
FIG. 1 is a block diagram of a data processing system in accordance with one embodiment.

Before discussing the embodiments with reference to the accompanying figures, the following description of embodiments is provided.

In one example configuration, a computer implemented method is provided for generating a key for use in computing an error protection code for an input data value according to a chosen error protection scheme. In particular, a plurality of data value sizes are input, and a key generation algorithm is then applied to generate a key for use in computing the error protection code for a maximum data value size amongst the plurality of data value sizes. In generating the key, the key generation algorithm produces the key such that it comprises a plurality of sub-keys, where each sub-key is associated with one of the input data value sizes and conforms to a key requirement for the chosen error protection scheme.

As a result, the generated key effectively forms a generic set of sub-keys, each of which conforms to the requirements of a key for the error protection scheme, and each of which is associated with a particular one of the input data value sizes. Accordingly, for any particular data value size amongst the input plurality of data value sizes, error protection circuitry can be arranged to perform a computation utilising the relevant sub-key selected from the key generated in the above described manner. This provides a significant reduction in design and verification cost when designing error protection circuits to handle a variety of different data value sizes. In particular, the same generic set of sub-keys provided by the generated key can be referred to in each instance, and the relevant sub-key extracted having regards to the required data value size.

The key generation algorithm will depend on the error protection scheme chosen. For example, it will be understood that the number of bits required in the error protection code for a data value of a particular size will vary dependent on the error protection scheme chosen, and there will typically be rules specifying how the key should be generated from the data value dependent on the error protection scheme. In accordance with the present technique, the key generation algorithm not only generates a key associated with the maximum data value size, where that key conforms to the key requirements of the error protection scheme, but also ensures that each individual sub-key also conforms to the key requirements for the error protection scheme, having regards to the associated data value size for that sub-key. This hence enables each of the individual sub-keys to be used independently.

In one embodiment, the key (which as mentioned earlier is effectively a generic set of sub-keys for different data value sizes) is output by the computer implemented method, so that it can then be used as an input in generating error protection circuits conforming to the error protection scheme. The error protection circuits can take a variety of forms, and hence for example may be error protection code generation circuits (also referred to herein as ECC generation circuits) for generating the error protection code for an input data value of a particular size, or may be error checking circuits used to detect, and potentially correct, errors identified in a data value based on an analysis of the data value and the associated ECC. In both instances, the relevant sub-key associated with the size of data being processed is used in the computation performed by the error protection circuits.

There are a number of ways in which the key generation algorithm can be arranged to generate the key so as to comprise a plurality of sub-keys. However, in one embodiment the step of applying the key generation algorithm comprises computing a sequence of sub-keys, such that each sub-key in the sequence other than a first sub-key contains an immediately preceding sub-key in the sequence, with the remaining portion computed to ensure that the key requirement is conformed to, and with the final sub-key forming the key to be used in computing the error protection code for said maximum data value size.

Hence, the sequence of sub-keys effectively form a nested sequence, where a portion of a sub-key is formed by the immediately preceding sub-key.

In one embodiment, the step of applying the key generation algorithm comprises processing the plurality of data sizes in increasing size order, such that the first sub-key computed is a sub-key for a smallest data value size amongst said plurality of data sizes. Then, for each subsequent sub-key in the sequence, that sub-key is computed by incorporating therein the immediately preceding sub-key in the sequence, determining the remaining portion of the sub-key having regard to the associated data value size, and computing values for the remaining portion of the sub-key such that the key requirement is conformed to.

In one embodiment, each of the sub-keys contains a matrix of values arranged in rows and columns. In one such arrangement, for each subsequent sub-key in the sequence, the immediately preceding sub-key occupies a subset of the columns of that subsequent sub-key, and the step of computing the remaining portion of the sub-key includes filling the remaining column values within the subset of columns with a predetermined value, and computing the values for the remaining columns not in said subset of the columns.

The exact location at which the immediately preceding sub-key is located within the current sub-key being generated can vary dependent on embodiment. In one embodiment, the immediately preceding sub-key is positioned so that one of its corners is co-located with the corner of the current sub-key being generated. As mentioned above, for the subset of the columns that the immediately preceding sub-key occupies, the remaining column values within that subset of columns for the current sub-key being generated can be filled with a predetermined value, in one embodiment the predetermined value being a zero value. Accordingly, all that is then required is to generate the values for the remaining columns that are not in the subset of columns occupied by the immediately preceding sub-key. These can be generated using the key generation algorithm having regard to the rules applicable for the chosen error protection scheme that may dictate allowable sequences of values for those columns.

In one embodiment, when computing the values for the remaining columns not in said subset of the columns, the key generation algorithm excludes any value sequences already present in the subset of the columns. For many error protection schemes, it will be necessary to ensure that none of the columns within a particular sub-key have the same sequence of values.

There are a number of ways in which the plurality of data value sizes used as an input to the key generation method can be specified. For example, in one embodiment the plurality of data sizes are specified independently, for example as a list of required data values sizes. However, in an alternative embodiment the plurality of data sizes may be determined by input of a range identifying a minimum data value size and a maximum data value size. The actual data value sizes can then be determined from the range in a variety of ways, for example to incorporate every integer value within the range, to apply a predetermined stride when selecting the required data value sizes within the range, etc.

In one embodiment, a non-transitory computer program product can be provided containing a computer program which, when executed on a computer, performs the method of generating a key as outlined above. This would hence for example enable a general purpose computer to perform the necessary steps required to generate the key containing a generic set of sub-keys for the different specified data value sizes. Alternatively, a dedicated apparatus could be provided for generating the key based on the input data value sizes.

The key generated by the above described technique can be used in a wide variety of different situations. However, it can be particularly beneficially applied within a data processing system having multiple error protection circuits, with data of various different data value sizes being processed within the system, and accordingly with some error protection circuits needing to operate on data value sizes different to other error protection circuits.

For example, in one embodiment a data processing system may be provided comprising a plurality of error protection circuits including at least a first error protection circuit for handling data values of a first data value size, and a second error protection circuit for handling data values of a second data value size different to said first data value size. The first and second error protection circuits comprise computation circuitry to perform a computation utilising a sub-key selected from a key generated in accordance with the above described computer-implemented method, for each of the first and second error protection circuits the sub-key being selected based on the associated data value size handled by that error protection circuit.

The use of the key generated by the earlier described method when designing such a data processing system can give rise to significant reductions in design and verification cost associated with the data processing system. In particular, instead of the known prior art approach where unique keys are generated for different data value sizes, which all need to be documented separately and require the associated error protection circuits to be designed accordingly, when using the earlier described mechanism of the present technique for generating a key, since the key effectively provides a generic set of sub-keys associated with different data value sizes, that generic key can be referenced each time, and the relevant sub-key extracted from it, significantly reducing the design and verification costs associated with the provision of the error protection circuits within the data processing system.

In one embodiment, all of the various error protection circuits can be self-contained, comprising computation circuitry configured having regards to the appropriate sub-key. Hence, in such an arrangement, the computation circuitry in each of the earlier-mentioned first and second error protection circuits would implement a function utilising the entirety of the selected sub-key for that error protection circuit.

However, in an alternative embodiment, it is possible within certain of the error protection circuits to reduce the size and complexity of the computation circuitry, by re-using the output from a computation circuit associated with an error protection circuit handling a different data value size. In particular, in one embodiment, the computation circuitry in the first error protection circuit implements a function utilising the entirety of the selected sub-key for the first error protection circuit, and the computation circuitry in the second error protection circuit implements a first function utilising a determined portion of the selected sub-key for the second error protection circuit, and a second function utilising an output of the function implemented by the computation circuitry in the first error protection circuit. Hence, in this embodiment the computation circuitry in the second error protection circuit only needs to utilise a determined portion of the selected sub-key for that error protection circuit, and can re-utilise the output from the computation circuitry in the first error protection circuit.

In one particular example arrangement, the first data value size is smaller than the second data value size, which will be referred to herein as an upscaling embodiment. In particular, in this instance the second error protection circuit is operating on a data value size that is larger than that processed by the first error protection circuit, but utilises the output from the first error protection circuit when computing its required output, hence enabling a reduction in the size of the computation circuitry in the second error protection circuit.

In an alternative embodiment, the first data value size is larger than the second data value size, which will be referred to herein as a downscaling embodiment. In such a downscaling embodiment the output from the first error protection circuit can still be used to reduce the complexity of the computation circuitry in the second error protection circuit.

Accordingly, through use of such upscaling and downscaling embodiments, the overall size of the computation circuitry required can be reduced, which can give rise to both performance and energy savings.

As mentioned earlier, the error protection circuits can take a variety of forms. In one embodiment the first and second error protection circuits are error protection code generation circuits for generating an error protection code using the selected sub-key and an input data value.

In one particular embodiment, within the second error protection circuit the second function is arranged to apply an operation using as inputs an output from the first function and data derived from the output of the function implemented by the computation circuitry in the first error protection circuit.

In an alternative embodiment, the first and second error protection circuits are error checking circuits used to generate syndrome information using the selected sub-key, an input data value, and an associated error protection code. In one particular embodiment where the first and second error protection circuits are error checking circuits, those first and second error protection circuits implement a function utilising the entirety of the selected sub-key for that error protection circuit.

Particular embodiments will now be described with reference to the Figures.

FIG. 1 is a block diagram of a data processing system 10 in which the techniques of the described embodiments can be implemented. In this example system, a processing circuit 15, which may for example be a central processing unit (CPU), is arranged to communicate with a variety of other components 25, 35, 45, 55 and also with an on-chip memory 70. The components 25, 35, 45, 55 can take a variety of forms, and hence may for example be memory interfaces, cache control interfaces, etc. As shown in the figure, data values of various different sizes are transferred between the CPU 15 and the various components. For the sake of illustration, only certain channels of communication are shown, and in particular, with regard to components 25, 35 and 45, a communication channel transferring data from the CPU 15 to those components is shown, with associated ECC generator circuitry 20, 30, 40 being provided within the CPU for generating ECC codes to be associated with the data transferred to the components 25, 35, 45, respectively, and with each of the components including associated ECC check circuits 22, 32, 42 for detecting and potentially correcting errors in the data, as determined by analysis of the data and associated ECC.

Further, in the illustrated example, it is assumed that the component 55 is transmitting data to the CPU 15, and accordingly the associated ECC generator circuitry 50 is provided within the component 55, and the ECC check circuitry 52 is provided within the CPU 15.

With regard to the communication between the CPU 15 and the memory 70, it is assumed that the memory does not perform any error correction code generation or checking, but merely stores the provided data and associated ECC within the memory, so that when the data is subsequently retrieved, error checking can be performed. Accordingly, in that embodiment, combined ECC generator and check circuitry 60 can be provided for communicating via a bus interface 65 with the memory 70. When a data value is written into the memory, associated ECC data will be generated for storing in the memory in association with the data value, and then when the data value is subsequently retrieved, check circuitry within the CPU will detect any errors in the data based on analysis of the data value and associated ECC.

As will be well understood, a number of different error protection schemes exist, and the size of ECC data required for a particular data value size will vary dependent on the error protection scheme. For example, one type of error protection scheme is the SEDDED (Single Error Detect, Double Error Detect) scheme, whilst another known error protection scheme is the SECDED (Single Error Correct, Double Error Detect) scheme. For any particular size of data value, the SECDED scheme will typically require more ECC bits than the SEDDED scheme. In the example illustrated in FIG. 1, the example ECC sizes shown are for the SECDED scheme. Hence, an 8-bit data value passed from the CPU 15 to component 25 is accompanied by a 5-bit ECC, a 32-bit data value transferred from the CPU 15 to the component 35 is accompanied by a 7-bit ECC, a 16-bit data value passed from the CPU 15 to the component 45 is accompanied by a 6-bit ECC, and a 64-bit data value transferred from the component 55 to the CPU 15 is accompanied by an 8-bit ECC.

Figure 2:
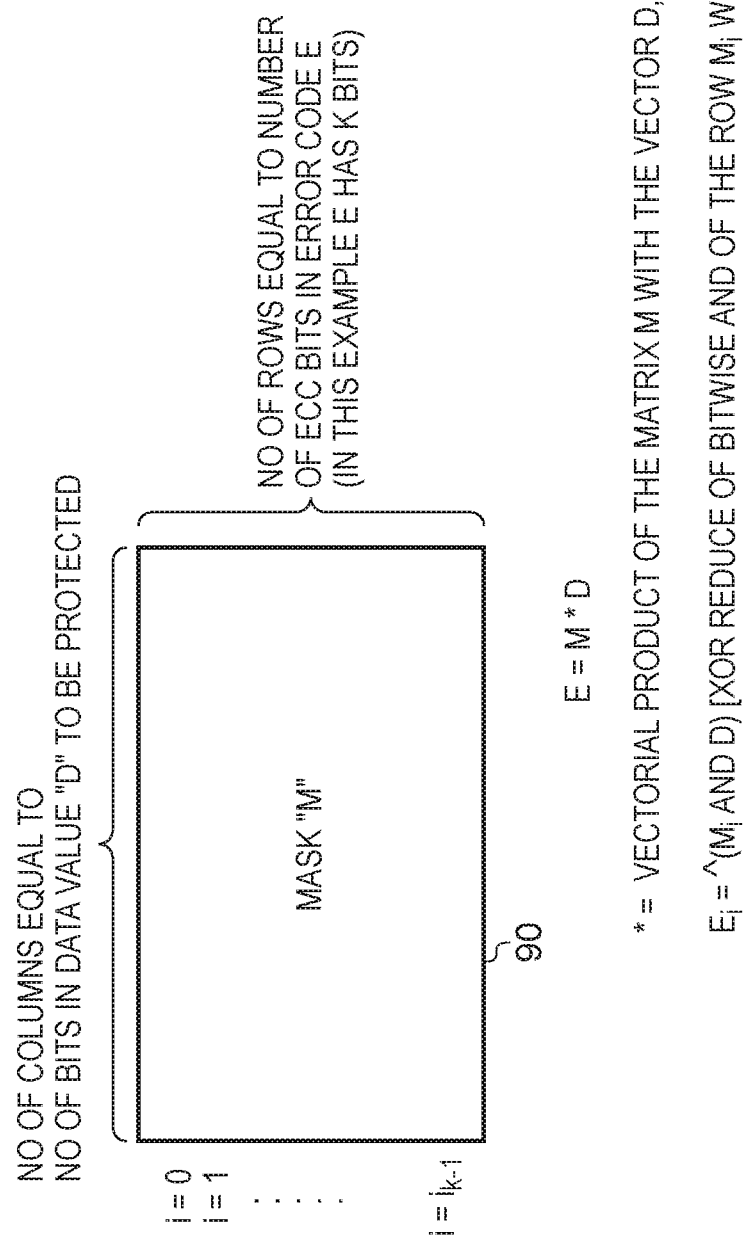
FIG. 2 schematically illustrates a mask used in one embodiment, and the associated computation for computing an error correction code for a received data value.

When generating an error correction code E from an input data value D, a computation is performed on that data value using a key of an appropriate size. The key can also be described as a mask, and FIG. 2 illustrates an example mask M. The mask can be considered to form a matrix of values arranged in rows and columns. As shown in FIG. 2, the mask 90 is configured so that the number of rows is equal to the number of ECC bits in the error code E, whilst the number of columns is equal to the number of bits in the data value D to be protected by the ECC. Hence considering the earlier example of an 8-bit data value being protected by a 5-bit ECC, the mask M would have five rows and eight columns, with a logic one or a logic zero value being provided at each matrix location within the mask.

Typically, ECC generation is performed in a similar manner regardless of the kind of protection the scheme gives, and can be represented by the equation:

$$E=M*D$$

The asterisk symbol represents the vectorial product of the matrix M with the vector D, such that each bit of the ECC equates to an XOR reduction of the bitwise AND of the corresponding row of the matrix with the vector D.

The actual form of the mask will depend on the chosen error protection scheme, and in particular an algorithm can be used to select appropriate values for each of the columns within the mask having regard to the chosen error protection scheme. Typically, in known prior art systems, each time a mask is required for a particular size of data value, the mask is uniquely generated based on the application of such an algorithm, and accordingly, for any chosen error protection scheme, the mask generated for one particular data value size will have no correlation with the mask generated for a different data value size. This can give rise to significant design and verification costs when incorporating multiple error protection circuits within a data processing system, where those error protection circuits are processing different sized data, as in the example of the system discussed earlier with reference to FIG. 1.

However, in accordance with the technique of one embodiment, a method is provided for generating a generic mask that incorporates a sequence of sub-masks within it, where each of the sub-masks is associated with a particular input data value size, and each of the sub-masks independently conforms to the mask requirements of the error protection scheme. This process will be described further with reference to FIG. 3.

Figure 3:
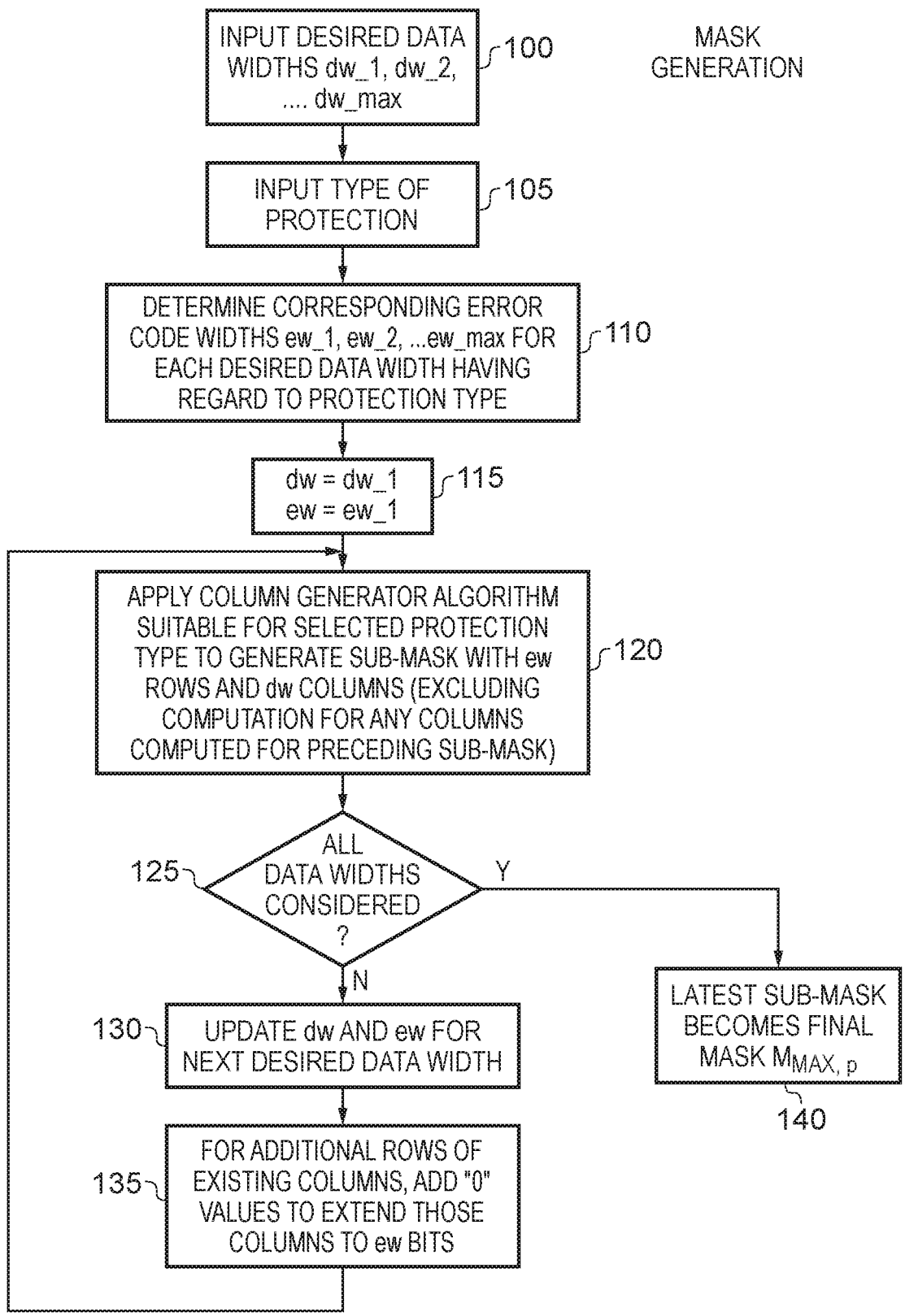
FIG. 3 is a flow diagram illustrating a mask generation technique in accordance with one embodiment.

At step 100, the desired data widths to be protected are input. These can be specified individually, or with reference to a range from which the desired data widths are determined. As shown in FIG. 3, these data widths are labelled dw_1, dw_2, . . . dw_max.

At step 105, the type of protection is identified, which will have a bearing on the number of ECC bits required for each data width, the algorithm used to populate the various columns of the mask, etc.

At step 110, the corresponding error code widths ew_1, ew_2, . . . ew_max are determined for each of the desired data widths having regard to the protection type input at step 105. Thereafter, the parameters dw and ew are set equal to dw_1 and ew_1, respectively, at step 115.

At step 120, the column generator algorithm applicable for the particular protection type is applied in order to generate a sub-mask with ew rows and dw columns. This process excludes a computation for any columns computed for a preceding sub-mask. During the first iteration there will be no preceding sub-mask, and accordingly the column generator algorithm generates each of the columns.

At step 125, it is determined whether all data widths that were input at step 100 have been considered. If so, then the process is complete, and branches to step 140 where the latest sub-mask becomes the final mask $M_{MAX,P}$. However, for at least the first iteration this will not be the case and the process will proceed to step 130, where dw and ew are updated for the next desired data width. Thereafter, at step 135 for any additional rows within existing columns, logic zero values are added to extend those columns to ew bits in length. Thereafter, the process returns to step 120.

As a result of this process, a generic mask $M_{MAX,P}$ will be generated that itself contains a plurality of sub-masks, each sub-mask being associated with a particular input data width, and each sub-mask conforming to the mask requirements for the error protection scheme, i.e. enabling that sub-mask to be used independently. This is illustrated schematically in FIG. 4, where the maximum sized mask $M_{MAX}$ associated with the largest input data width is constituted by the sub-mask 150, this being the final sub-mask created. However, the process of generating that mask starts with the generation of the mask 160 for the smallest specified data width, and then is repeated iteratively for each subsequent sub-mask 170, 180, etc associated with each of the other specified data widths. The plurality of data size widths are processed in increasing size order.

Figure 4:
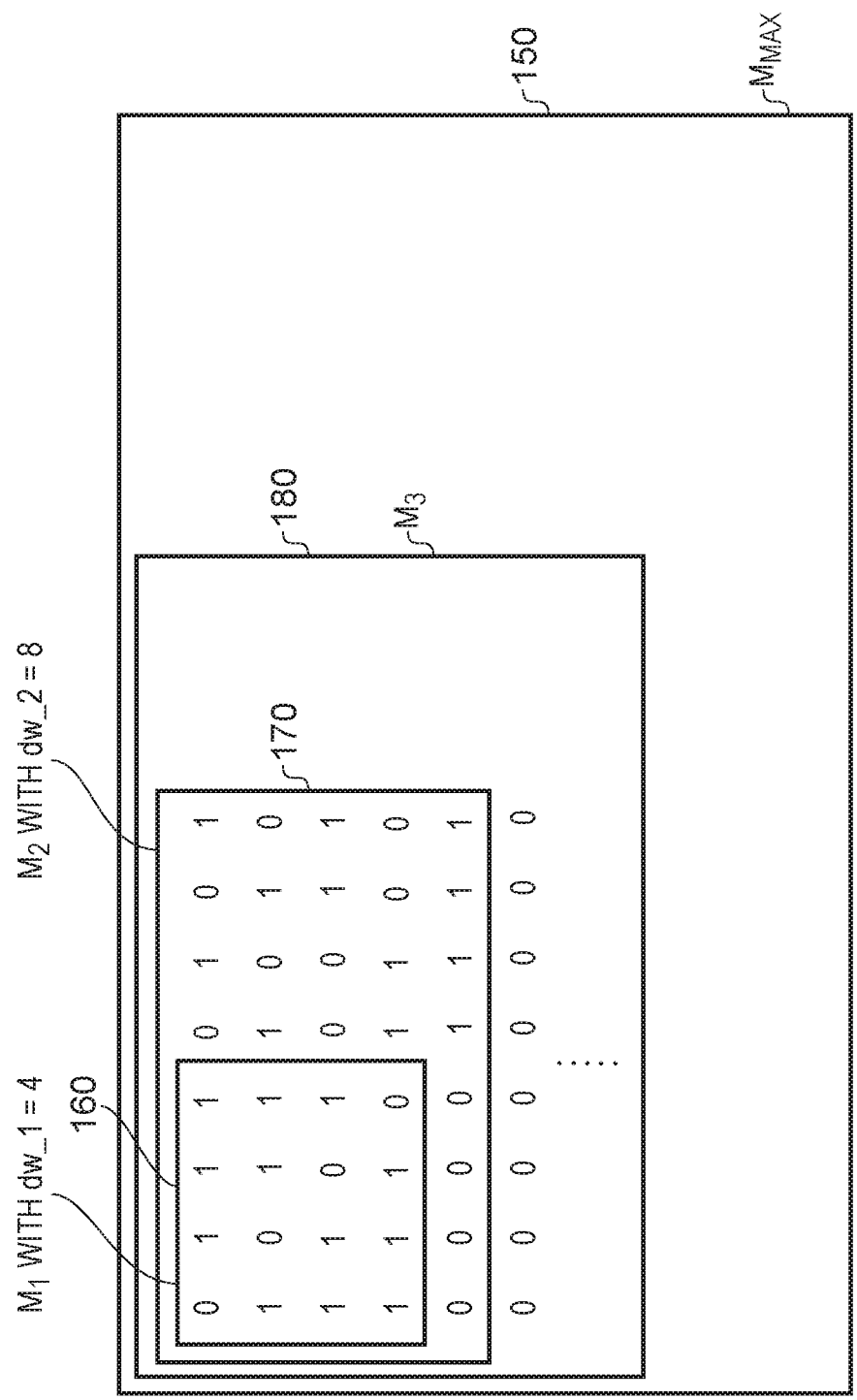
FIG. 4 illustrates a sequence of sub-masks generated in accordance with one embodiment when adopting the approach of FIG. 3.

In the example shown in FIG. 4, it is assumed that the smallest data width specified is 4-bits, the second data width specified is 8-bits, and thereafter a number of further data sizes are specified. As mentioned earlier, the number of rows within each sub-mask will depend on the type of protection scheme used, but for the earlier mentioned SECDED scheme, there will need to be four rows for a data width size of four, and five rows for a data width size of eight. This is shown schematically by the masks 160, 170. On a first iteration, the column generator algorithm will generate the four columns of values shown within the sub-mask 160. Thereafter, the original dw and ew values of four and four will be updated to eight and five in order to specify the next sub-mask 170. In this example, the sub-mask 160 occupies the upper left part of the sub-mask 170, and all of the columns containing the sub-mask 160 are extended with logic zero values. This is performed at step 135 of FIG. 3. During the next iteration of step 120, then the four additional columns of five values shown within the sub-mask 170 are computed having regard to the rules of the chosen error protection scheme. When the next sub-mask 180 is considered, all of the eight columns associated with the sub-mask 170 are again extended with logic zero values for any additional rows within the sub-mask 180, as illustrated schematically in FIG. 4, and then remaining part of the sub-mask is computed. This process is continued until the final sub-mask 150 associated with the maximum data width size specified is computed, at which point that sub-mask becomes the final mask $M_{MAX,P}$.

FIG. 5 is a table illustrating the ECC widths ew for various different data widths dw, for both the SECDED scheme and the SEDDED scheme. As can be seen from the table 190, the number of ECC bits for any particular data width will be more when employing the SECDED scheme, when compared with the SEDDED scheme. This is due to the additional information required to enable an error to be corrected rather than just detected.

The various specified data sizes for which associated sub-masks need to be generated can take any arbitrary form. Whilst in the example of FIG. 5 most of the values are double the preceding value, there is no requirement for this, and indeed it will be seen that one of the examples given is a data width of 47, which has no particular relationship to the preceding specified data widths.

Figure 6:
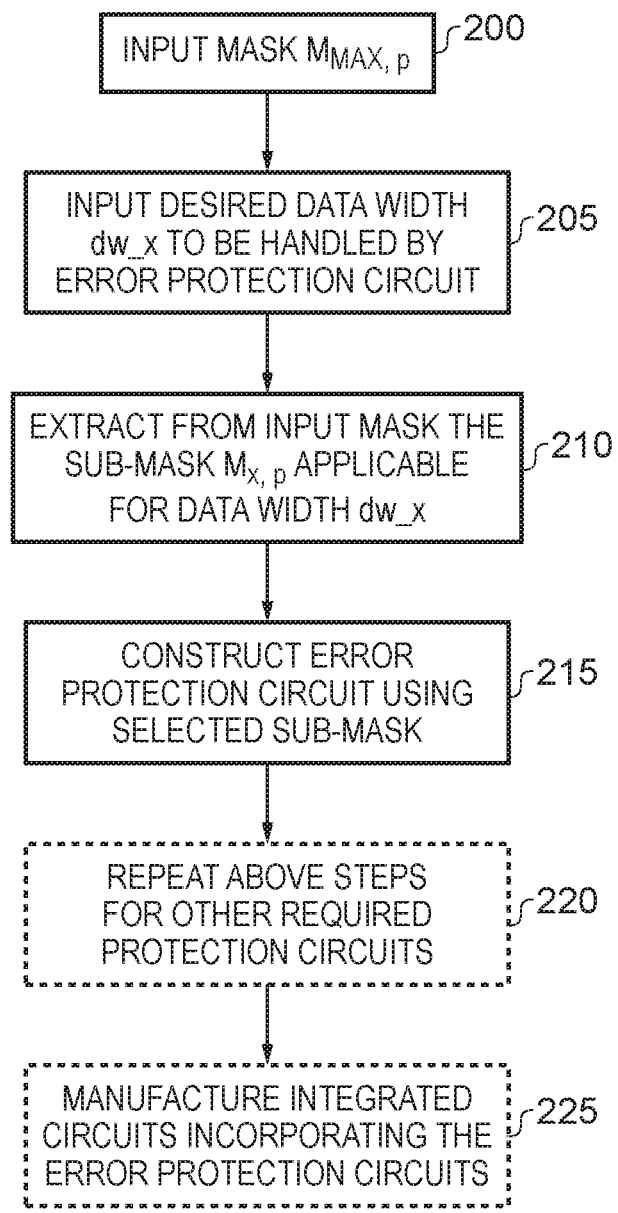
FIG. 6 is a flow diagram illustrating the steps performed when generating an error protection circuit in accordance with one embodiment.

Having generated a generic mask containing a set of sub-masks in the manner discussed with reference to the preceding figures, it is then possible to design individual error protection circuits using the generic mask, and in particular using the relevant sub-mask from within the generic mask. This process is illustrated schematically in FIG. 6. At step 200, the maximum sized mask $M_{MAX,P}$ is input, this being the mask applicable for the chosen protection type p. At step 205, the desired data width dw_x to be handled by the error protection circuit is input, and then at step 210 the relevant sub-mask is extracted from the input mask, the relevant sub-mask being the sub-mask applicable for the specified data width dw_x. Thereafter, at step 215 an error protection circuit is constructed using the selected sub-mask.

The error protection circuit can take a variety of forms, and hence for example may take the form of an ECC generator circuit used to generate an ECC code E from corresponding input data D using the selected sub-mask M. In particular, as discussed earlier, the ECC generator circuit will be arranged to perform the computation:

$$E_X = M_{X,P} * D_X$$

where the asterisk represents the vectorial product of the matrix $M_X$ with the vector $D_X$, i.e. the vectorial product defined earlier.

However, in an alternative embodiment the error protection circuit may take the form of an ECC checking circuit used to determine whether there are any errors in a data value based on an analysis of that data value and its associated ECC, and then potentially correct any detected error dependent on the error protection scheme, i.e. the protection type P. In particular, in such an embodiment, the ECC checker circuit will be arranged to generate syndrome information $S_X$ by performing the following computation:

$$S_X = (M_{X,P}, I) * (D_X, E_X)$$

where
I is the identity matrix $$\begin{matrix} 1 & 0 & 0 & \ldots & 0 \\ 0 & 1 & 0 & \ldots & 0 \\ 0 & 0 & 1 & \ldots & 0 \\ \vdots & \vdots & \vdots & \ddots & \vdots \\ 0 & 0 & 0 & \ldots & 1 \end{matrix}$$

As can be seen, the identity matrix contains logic one values in the diagonal direction, with all other values being set equal to zero. The computation $M_{X,P}$, I is the horizontal concatenation of the two matrices formed by the mask M and the identify matrix I. The asterisk represents the vectorial product of the resulting matrix with the vector given by concatenating $D_X$ and $E_X$ together.

As will be well understood, once the syndrome data has been generated, then the syndrome information can be used to understand what errors have occurred, with that information then potentially being used to correct the errors dependent on the error protection scheme used.

The process outlined in steps 200, 205, 210 and 215 can be repeated as required for each error protection circuit that is required within the data processing system. Provided every error protection circuit operates on a data value of a size associated with one of the sub-masks within the input mask, then the same generic input mask can be used in all instances, hence significantly reducing design and verification costs. The process of repeating steps 200 to 215 for each of the required error protection circuits is shown schematically by the dotted box 220 in FIG. 6.

Once all of the required error protection circuits have been designed, then an integrated circuit can be manufactured incorporating the various error protection circuits, as indicated by the dotted box 225. It will be appreciated that the manufacture of the integrated circuit may be performed as an entirely separate process, and by an entirely separate entity, with the designer of the integrated circuit incorporating into the overall integrated circuit design the various error protection circuit designs generated using the process of steps 200 to 220, and thereafter manufacturing the integrated circuit. Indeed, it will also be understood that different entities may be responsible for designing the integrated circuit, and for subsequently manufacturing the integrated circuit according to that design.

Figure 7:
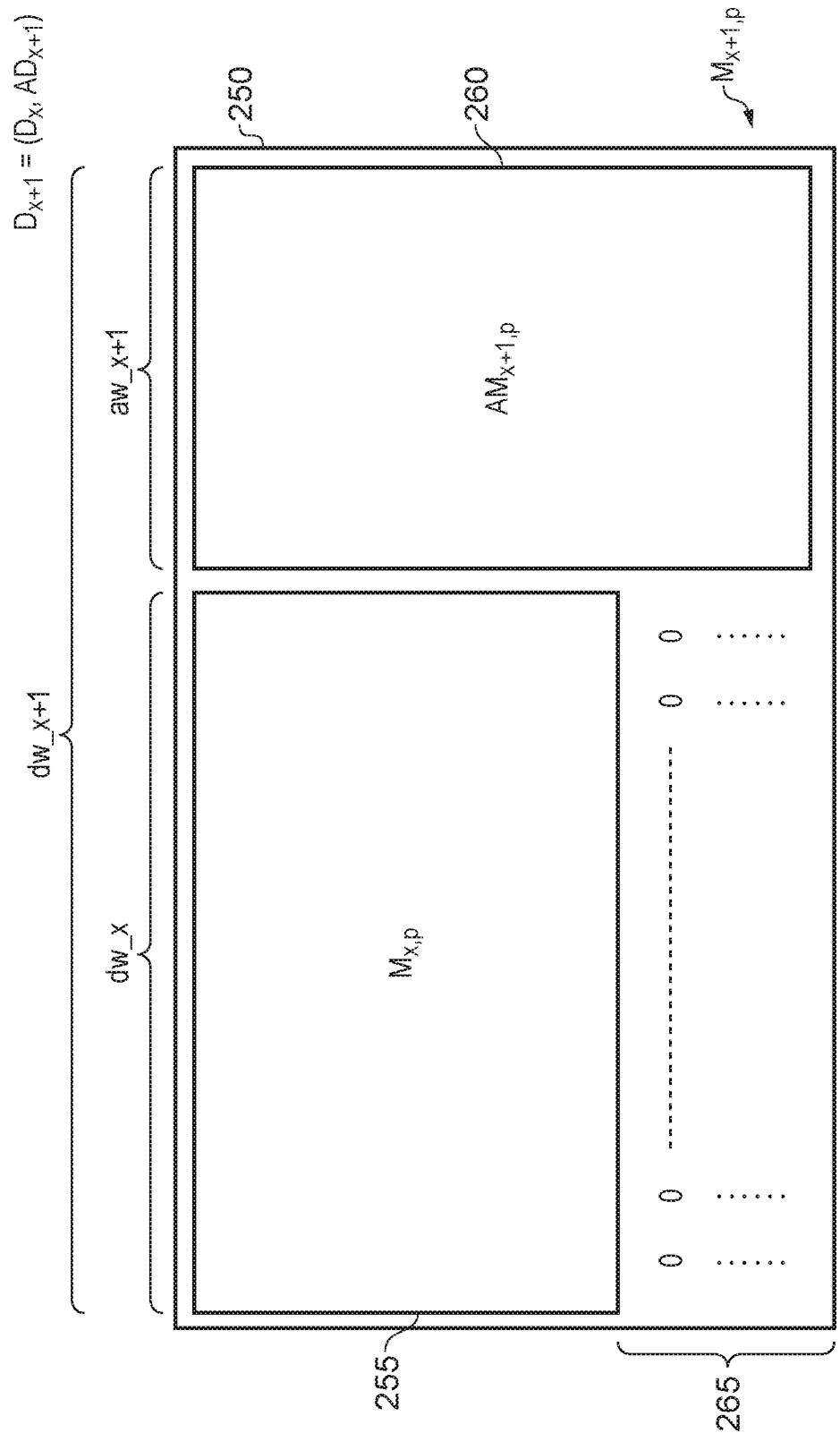
FIG. 7 illustrates various portions of a mask for a data value of size dw_x+1, when generated using the mechanism of one embodiment.

FIG. 7 schematically illustrates the relationship between a sub-mask $M_{X+1,P}$ and the preceding sub-mask $M_{X,P}$. In this example, it is assumed that dw_x is the data width associated with the mask $M_{X+1,P}$, and dw_x+1 is the data width associated with the next sub-mask $M_{X+1,P}$. The difference between the two data widths is indicated in FIG. 7 as aw_x+1.

As will be recalled from the earlier discussion of FIG. 3, once the mask $M_{X,P}$ 255 has been generated, then the mask $M_{X+1,P}$ 250 is generated by incorporating the mask 255, extending all of the columns incorporated by the mask 255 by adding logic zero values to the remaining rows 265, and then computing appropriate column values for the remaining columns. The resulting matrix for the remaining columns is denoted in FIG. 7 as $AM_{X+1,P}$ 260.

As will now be described with reference to FIGS. 8 and 9, by way of example with reference to the design of ECC generation circuitry, when designing the ECC generation circuitry used to produce the ECC code $E_{X+1}$, i.e. the ECC associated with the data value $D_{X+1}$ having the data width dw_x+1, it is possible to utilise the ECC code $E_X$ provided by an ECC generator used to compute that value from the data value $D_X$ having the data width dw_x.

Figure 8:
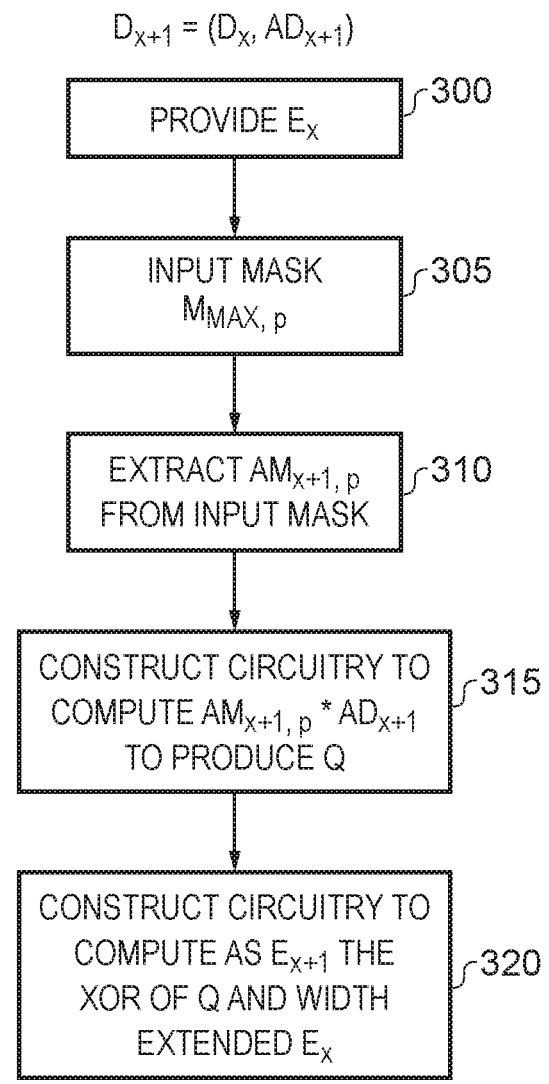
FIG. 8 is a flow diagram illustrating how an error correction code for a data value of size dw_x+1 can be generated from an error correction code for a data value of size dw_x in accordance with an upscaling mechanism of one embodiment.

In particular, as shown in FIG. 8, at step 300, the ECC code $E_X$ can be input, and thereafter at step 305 the generic mask $M_{MAX,P}$ can be input.

At step 310, the relevant portion of the sub-mask $M_{X+1,P}$ associated with the additional columns, namely the portion $AM_{X+1,P}$ 260 shown in FIG. 7 can be extracted from the input mask. Thereafter, at step 315, circuitry can be constructed to perform the computation $$AM_{X+1,P} * AD_{X+1}$$

in order to produce an internal value Q. Again the asterisk represents the vectorial product of the identified part of the mask with the vector representing the relevant data bits, in this case the data bits $AD_{X+1}$, i.e. the additional data bits that convert the data value $D_X$ into the data value $D_{X+1}$.

At step 320, circuitry is then constructed to compute as the ECC $E_{X+1}$ the XOR of Q and a width extended version of the ECC $E_X$.

Figure 9:
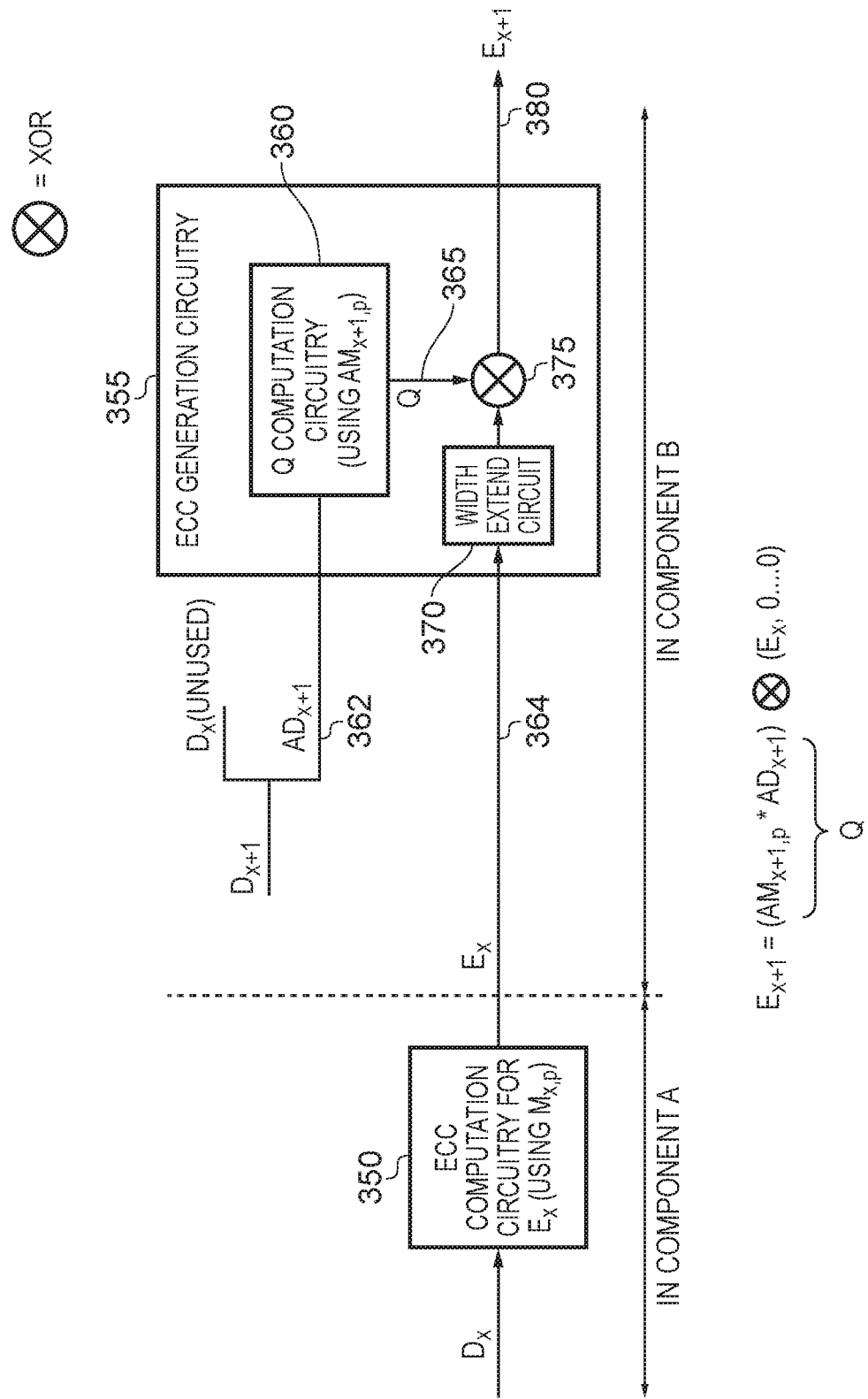
FIG. 9 is a block diagram illustrating error correction code generation circuitry arranged to operate in accordance with the method of FIG. 8 in accordance with one embodiment.

This is illustrated further with reference to FIG. 9. In particular, a component 350 performs the ECC computation required to generate the ECC $E_X$ for the input data $D_X$. This is performed in the standard way using the relevant sub-mask $M_{X,P}$.

Further ECC generation circuitry 355 is then provided for generating the ECC $E_{X+1}$ from the associated input data $D_{X+1}$. Whereas in one embodiment such ECC generation circuitry could be constructed in much the same way as the component 350, using the entirety of the relevant mask $M_{X+1,P}$, the arrangement shown in FIG. 9 enables a reduction in the size and complexity of the ECC generation circuitry by making use of the ECC $E_X$ already generated by the component 350. In particular, the additional data portion $AD_{X+1}$ is extracted from the input data $D_{X+1}$ and input over path 362 into the Q computation circuitry 360. This performs the computation discussed earlier with reference to step 315 of FIG. 8, using the relevant mask portion $AM_{X+1,P}$ and the input data over path 362.

The circuitry 370 width extends the ECC $E_X$ input over path 364, by appending a series of logic zero values to extend the width of $E_X$ so as to have the same width as $E_{X+1}$. The component 375 then performs an XOR operation using Q and the output from the width extend circuit 370, in order to produce as the output over path 380 the ECC $E_{X+1}$.

Due to the fact that the computation performed by the block 360 only needs to be performed in relation to the sub-section of the mask 260 shown in FIG. 7, this can significantly reduce the size and complexity of the ECC generation circuitry.

Whilst all of the components shown in FIG. 9 may be provided within the same component of a data processing system, it is possible in alternative embodiments that the ECC computation circuitry 350 may reside in an entirely separate component to the component containing the ECC generation circuitry 355. For example, considering the particular example of FIG. 1, the ECC generator circuitry 20 may include the component 350 for generating the error correction code $E_X$ for an 8-bit data value, and with the resultant ECC $E_X$ also being provided as an input to the ECC generator circuitry 40 which incorporates the functionality shown by the block 355 in order to generate an ECC $E_{X+1}$ for a 16-bit data value.

The process described above with reference to FIGS. 8 and 9 will be referred to as an upscaling arrangement in the present application.

In an alternative embodiment, it is possible to support downscaling embodiments where the ECC $E_{X+1}$ generated for a data value $D_{X+1}$ is then also used to assist in the generation of the ECC $E_X$ for a reduced size data value $D_X$. One such embodiment is shown in FIG. 10.

Figure 10:
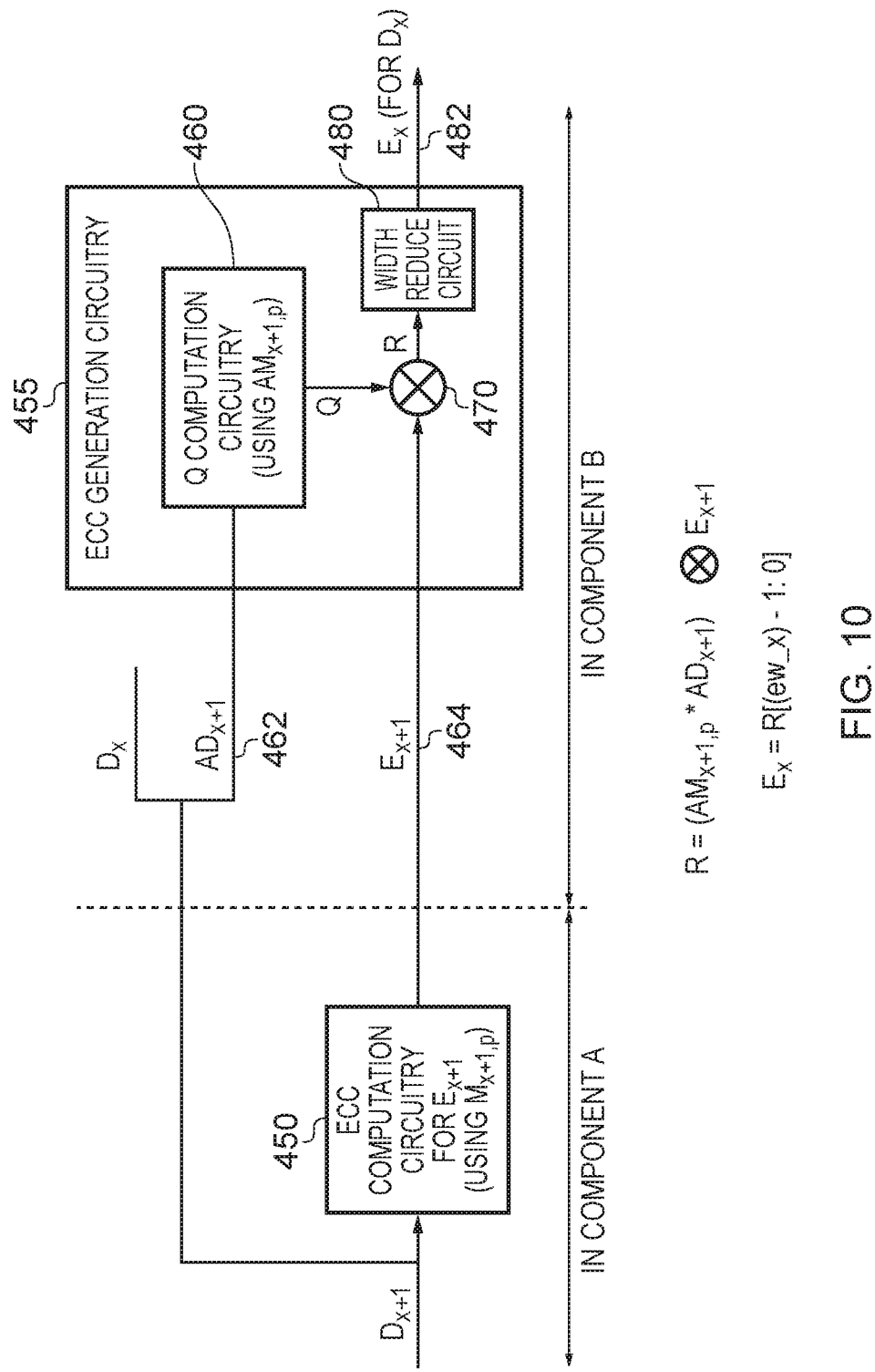
FIG. 10 is a block diagram illustrating error correction code generation circuitry arranged to perform a downscaling operation to generate an error correction code for a data value of size dw_x from the error correction code produced for a data value of size dw_x+1, in accordance with one embodiment.

As shown in FIG. 10, ECC computation circuitry 450 is provided for computing the ECC $E_{X+1}$ for the associated data value $D_{X+1}$, using the relevant sub-mask $M_{X+1,P}$ shown in FIG. 7. Further ECC generation circuitry 455 is then provided for computing the ECC $E_X$ associated with the data value $D_X$, again $D_X$ and $D_{X+1}$ having the relationship shown at the top of FIGS. 7 and 8. The additional data section $AD_{X+1}$ is extracted and input over path 462 to the Q computation circuitry 460 which operates in the same way as discussed for the Q computation circuitry 360 of FIG. 9.

The circuitry 470 performs an XOR operation on the output Q from the Q computation circuitry 460 and the ECC $E_{X+1}$ input over path 464 from the circuitry 450, to produce an internal value R. From R, the ECC $E_X$ can be determined using the width reduce circuit 480, which as shown in FIG. 10 extracts the required number of least significant bits from the value R, the number of bits extracted being equal to the width of the ECC $E_X$. The resultant value for $E_X$ is then output over path 482.

Figure 11C:
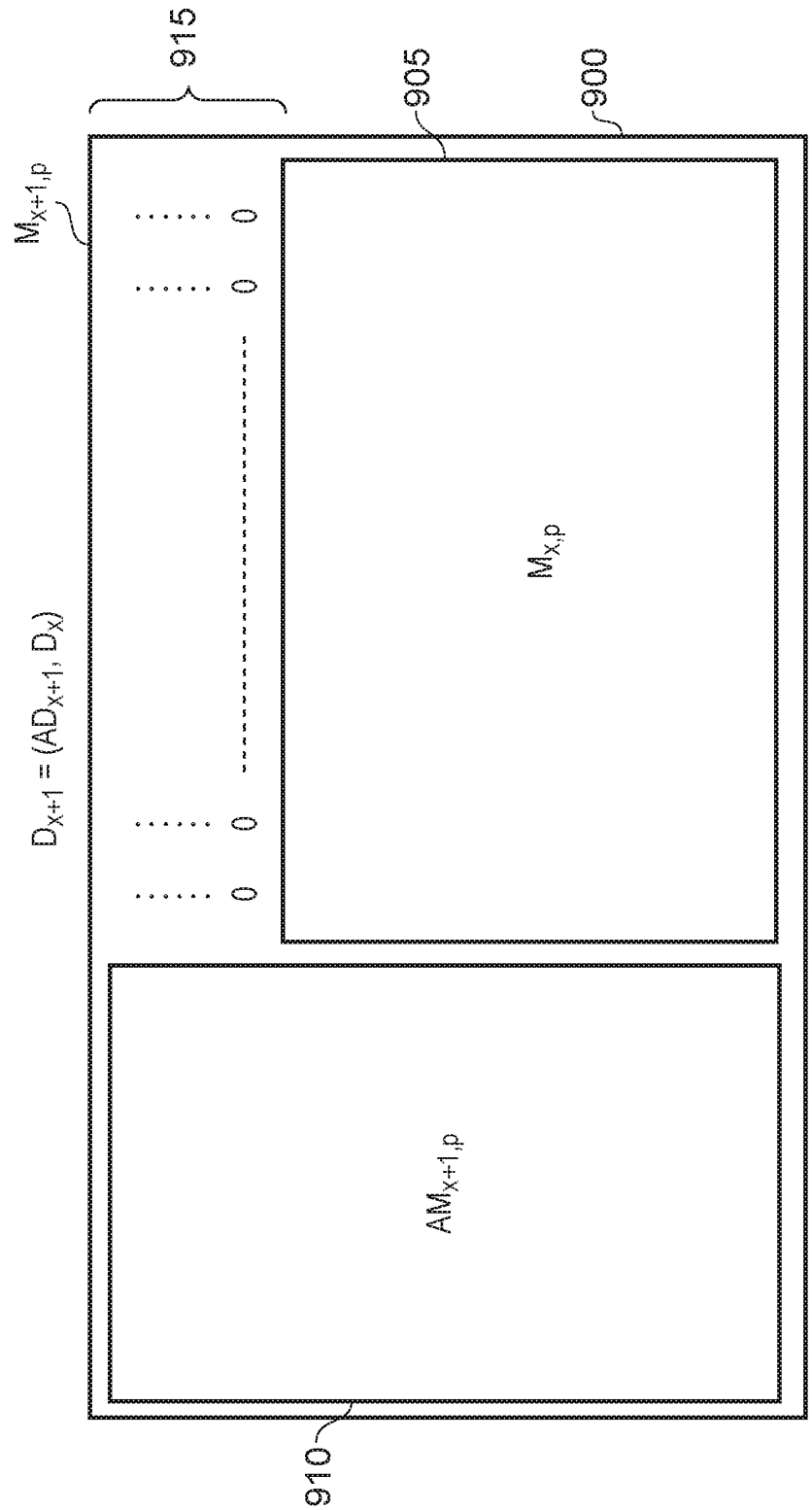

FIGS. 11A to 11C illustrates alternative ways of arranging the various sub-masks, whilst still allowing the above-described upscaling and downscaling embodiments to be performed. As can be seen from a comparison of FIG. 11A with FIG. 7, the mask $M_{X,P}$ 405 is positioned at the bottom left of the next sub-mask $M_{X+1,P}$ rather than in the upper left as shown in FIG. 7. Again logic zero values are added to the remaining rows of the columns containing the sub-mask $M_{X,P}$, as shown by the reference sign 415. Still further, it can be seen that the additional matrix section $AM_{X+1,P}$ 410 is also still provided, this corresponding to the section 260 in FIG. 7. The upscaling process of FIGS. 8 and 9 can then be applied as previously described. However, the operation of the width extend circuit 370 will change slightly in that the logic zero values appended will form the most significant bit positions of the extended ECC $E_X$ (as shown by the equation in FIG. 11A), rather than the least significant bit positions as in the example of FIG. 7. Similarly, when adopting the downscaling embodiment of FIG. 10, the operation of the width reduce circuit 480 will change slightly, in that a number of most significant bits of R are selected to form $E_X$ rather than a number of least significant bits, as shown by the equation set out in FIG. 11A.

FIG. 11B illustrates another possible arrangement for the sub-masks, where the sub-mask 425 is placed in the upper right hand corner of the next sub-mask $M_{X+1,P}$. As before, logic zero values 435 are used to extend the columns that are contained within the sub-mask 425, and an additional mask section $AM_{X+1,P}$ 430 is created in the standard manner. The operations of the width extend circuit 370 when upscaling and the width reduce circuit 480 when downscaling are shown in the equations set out in FIG. 11B.

FIG. 11C illustrates an alternative arrangement of the sub-masks to that shown in FIG. 11B, which can also facilitate the above described upscaling and downscaling embodiments. Here the sub-mask $M_{X,P}$ 905 is positioned at the bottom right of the next sub-mask $M_{X+1,P}$ 900, logic zero values 915 are added to extend the columns associated with the sub-mask 905, and then the additional mask section $AM_{X+1,P}$ 910 is calculated, this section corresponding to the section 430 shown in FIG. 11B. The operations of the width extend circuit 370 when upscaling and the width reduce circuit 480 when downscaling are shown in the equations set out in FIG. 11C.

The above described upscaling and downscaling embodiments can enable a significant saving in energy and/or area, and also give rise to performance improvements.

In principle, the upscaling and downscaling arrangements could also be utilised in some embodiments in relation to ECC checking circuits used to generate syndrome information from the received data and ECC information. However, in one embodiment such techniques are not used for the ECC checking circuits, and instead each ECC checking circuit is generated using the approach discussed earlier with reference to FIG. 6, and in particular utilising the entirety of the relevant sub-mask extracted from the generic mask.

Figure 12:
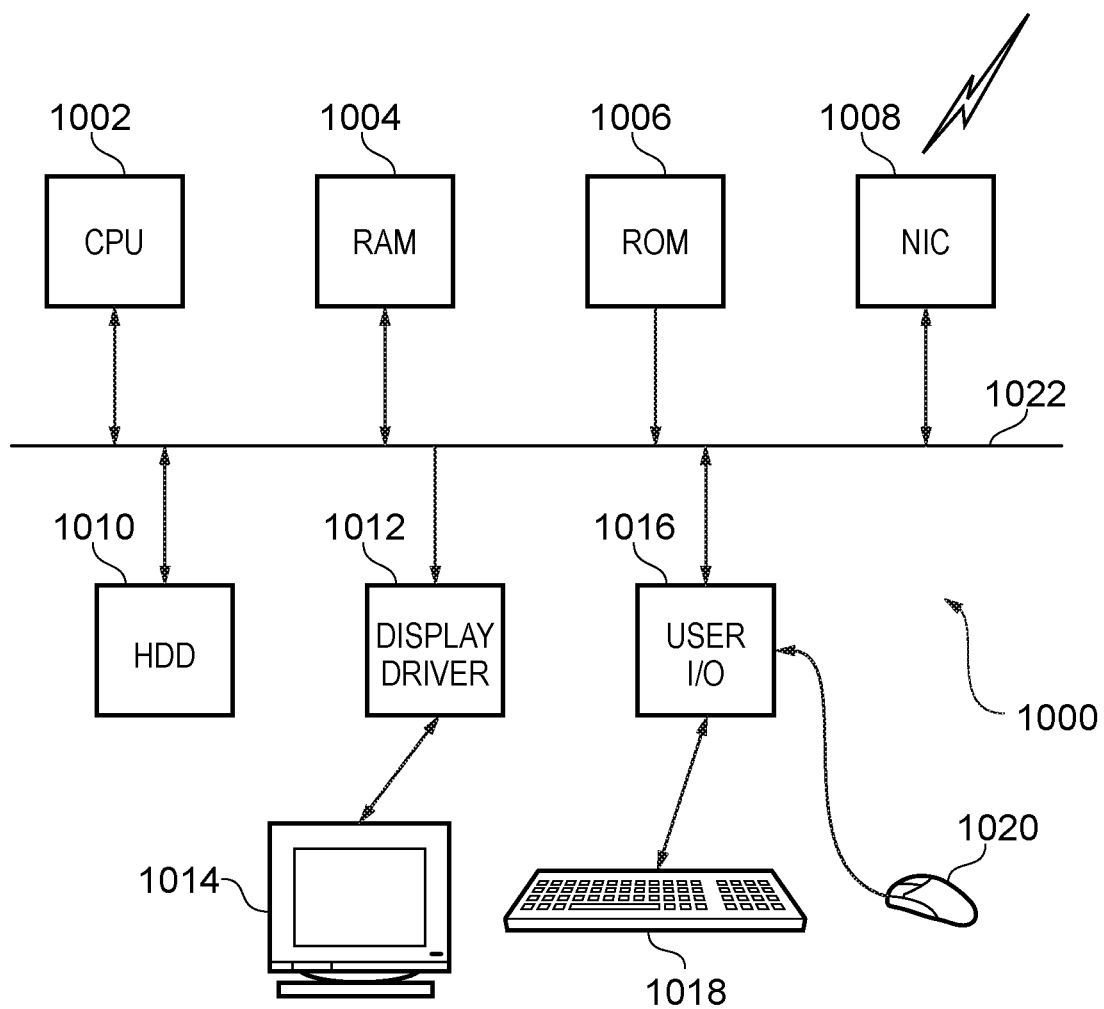
FIG. 12 schematically illustrates a general purpose computer of the type which can be used to implement the present techniques.

FIG. 12 schematically illustrates a general purpose computer 1000 of the type that may be used to implement the above described techniques, and in particular the generation of a key comprising a sequence of sub-keys for use in computing an error protection code for an input data value. The general purpose computer 1000 includes a central processing unit 1002, a random access memory 1004, a read-only memory 1006, a network interface card 1008, a hard disk drive 1010, a display driver 1012 and monitor 1014, and a user input/output circuit 1016 with a keyboard 1018 and mouse 1020 all connected via a common bus 1022. In operation the central processing unit 1002 will execute computer program instructions that may be stored in one or more of the random access memory 1004, the read-only memory 1006 and the hard disk drive 1010, or dynamically downloaded via the network interface card 1008. The results of the processing performed may be displayed to a user via the display driver 1012 and the monitor 1014. User inputs for controlling the operation of the general purpose computer 1000 may be received via the user input/output circuit 1016 from the keyboard 1018 or the mouse 1020. It will be appreciated that the computer program could be written in a variety of different computer languages. The computer program may be stored and distributed on a recording medium or dynamically downloaded to the general purpose computer 1000. When operating under control of an appropriate computer program, the general purpose computer 1000 can perform the above described key generation techniques and can be considered to form an apparatus for performing the above described techniques. The architecture of the general purpose computer could vary considerably, and FIG. 12 is only one example.

From the above described embodiments, it will be seen that such embodiments provide a mechanism for generating a generic mask containing a set of sub-masks, where each sub-mask is associated with a particular data width, and where each sub-mask itself meets the mask requirements for a chosen error protection scheme. This provides significant benefits when generating error protection circuits, whether they be ECC generation circuits or error checking circuits, for use within a data processing system, particularly in situations where the data processing system is required to process data values of various different widths, and hence such error protection circuits are required to handle the various different data width sizes. Further performance and efficiency gains can be achieved in some embodiments by utilising the above described upscaling and downscaling embodiments to further reduce the complexity of some of the components provided within the error protection circuits.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. A computer-implemented method performed in a data processing system, comprising:
inputting a plurality of data value sizes;
generating a key for computing an error protection code for a maximum data value size amongst said plurality of data value sizes, wherein the key comprises a plurality of sub-keys, each sub-key being associated with one of the input data value sizes and conforming to a key requirement for an error protection scheme,
wherein generating the key comprises performing a plurality of iterations of a sub-key generation process in order to generate a sequence of sub-keys providing a sub-key for each of the plurality of data value sizes, the sub-key generation process comprising:
during a first iteration of the plurality of iterations, generating a first sub-key forming the key to be used in computing the error protection code for a minimum data value size amongst the plurality of data value sizes, and
during the remaining plurality of iterations, processing the plurality of data value sizes in increasing size order in order to generate corresponding sub-keys, with the sub-key generated in a final iteration of the plurality of iterations forming the key to be used in computing the error protection code for the maximum data value size,
wherein for each sub-key in the sequence other than the first sub-key, the sub-key generation process includes computing that sub-key by incorporating therein the immediately preceding sub-key in the sequence, determining the remaining portion of the sub-key having regard to the associated data value size, and computing values for the remaining portion of the sub-key such that the key requirement is conformed to; and
wherein the plurality of sub-keys enable a data value having any of said plurality of data value sizes to be protected against errors when transmitted within a data processing system by employing the sub-key generated for the data value size of that data value.

2. A computer-implemented method as claimed in claim 1, wherein each of the sub-keys contains a matrix of values arranged in rows and columns, for each subsequent sub-key in the sequence, the immediately preceding sub-key occupies a subset of the columns of that subsequent sub-key, and the step of computing the remaining portion of the sub-key includes filling the remaining column values within the subset of columns with a predetermined value, and computing the values for the remaining columns not in said subset of the columns.

3. A computer-implemented method as claimed in claim 2, wherein said predetermined value is a zero value.

4. A computer-implemented method as claimed in claim 2, wherein when computing the values for the remaining columns not in said subset of the columns, any value sequences already present in the subset of the columns are excluded.

5. A computer-implemented method as claimed in claim 1, wherein the plurality of data sizes are specified independently.

6. A computer-implemented method as claimed in claim 1, wherein the plurality of data sizes are determined by input of a range identifying a minimum data size and a maximum data size.

7. A non-transitory computer program product providing a computer program which, when executed on a computer, performs a method as claimed in claim 1.

8. A computer-implemented method as claimed in claim 1, further comprising:
providing a first error protection circuit to process data of a first data value size from among the plurality of data value sizes, the first error protection circuit comprises first computation circuitry to perform a computation using a first sub-key extracted from the key, the first sub-key being associated with the first data value size; and
providing a second error protection circuit to process data of a second data value size from among the plurality of data value sizes, where the second data value size is different from the first data value size, and the second error protection circuit comprises second computation circuitry to perform a computation using a second sub-key extracted from the key, the second sub-key being associated with the second data value size.

9. A data processing system comprising:
processing circuitry configured to perform a method comprising:
inputting a plurality of data value sizes;
generating a key for computing an error protection code for a maximum data value size amongst said plurality of data value sizes, wherein the key comprises a plurality of sub-keys, each sub-key being associated with one of the input data value sizes and conforming to a key requirement for an error protection scheme,
wherein generating the key comprises performing a plurality of iterations of a sub-key generation process in order to generate a sequence of sub-keys providing a sub-key for each of the plurality of data value sizes, the sub-key generation process comprising:
during a first iteration of the plurality of iterations, generating a first sub-key forming the key to be used in computing the error protection code for a minimum data value size amongst the plurality of data value sizes, and
during the remaining plurality of iterations, processing the plurality of data value sizes in increasing size order in order to generate corresponding sub-keys, with the sub-key generated in a final iteration of the plurality of iterations forming the key to be used in computing the error protection code for the maximum data value size,
wherein for each sub-key in the sequence other than the first sub-key, the sub-key generation process includes computing that sub-key by incorporating therein the immediately preceding sub-key in the sequence, determining the remaining portion of the sub-key having regard to the associated data value size, and computing values for the remaining portion of the sub-key such that the key requirement is conformed to; and
wherein the plurality of sub-keys enable a data value having any of said plurality of data value sizes to be protected against errors when transmitted within a data processing system by employing the sub-key generated for the data value size of that data value.

10. A data processing system as claimed in claim 9, further comprising:
a plurality of error protection circuits including at least a first error protection circuit to handle data values of a first data value size, and a second error protection circuit to handle data values of a second data value size different from said first data value size;
said first error protection circuit and said second error protection circuit each comprises computation circuitry to perform a computation utilising a selected sub-key selected from said key, for each of the first and second error protection circuits the selected sub-key being selected based on the associated data value size handled by that error protection circuit; and the computation circuitry in each of the first and second error protection circuits implements a function utilising the entirety of the selected sub-key for that error protection circuit.

11. A data processing system as claimed in claim 10, wherein:
the computation circuitry in the first error protection circuit implements a function utilising the entirety of the selected sub-key for the first error protection circuit; and
the computation circuitry in the second error protection circuit implements a first function utilising a determined portion of the selected sub-key for the second error protection circuit, and a second function utilising an output of the function implemented by the computation circuitry in the first error protection circuit.

12. A data processing system as claimed in claim 11, wherein the first data value size is smaller than the second data value size.

13. A data processing system as claimed in claim 11, wherein the first data value size is larger than the second data value size.

14. A data processing system as claimed in claim 10, wherein the first and second error protection circuits are error protection code generation circuits for generating an error protection code using the selected sub-key and an input data value.

15. A data processing system as claimed in claim 14, wherein:
the computation circuitry in the first error protection circuit implements a function utilising the entirety of the selected sub-key for the first error protection circuit; and
the computation circuitry in the second error protection circuit implements a first function utilising a determined portion of the selected sub-key for the second error protection circuit, and a second function utilising an output of the function implemented by the computation circuitry in the first error protection circuit, wherein within the second error protection circuit the second function is arranged to apply an operation using as inputs an output from the first function and data derived from the output of the function implemented by the computation circuitry in the first error protection circuit.

16. A data processing system as claimed in claim 10, wherein the first and second error protection circuits are error checking circuits used to generate syndrome information using the selected sub-key, an input data value, and an associated error protection code.

\* \* \* \* \*